United States Patent
Skarp et al.

(10) Patent No.: US 7,476,420 B2
(45) Date of Patent: *Jan. 13, 2009

(54) PROCESS FOR PRODUCING METAL OXIDE FILMS AT LOW TEMPERATURES

(75) Inventors: Jarmo Skarp, Espoo (FI); Mervi Linnermo, Klaukkala (FI); Timo Asikainen, Vantaa (FI)

(73) Assignee: ASM International N.V., Bilthoven (NL)

(*) Notice: Subject to any disclaimer, the term of this patent is extended or adjusted under 35 U.S.C. 154(b) by 776 days.

This patent is subject to a terminal disclaimer.

(21) Appl. No.: 11/009,626

(22) Filed: Nov. 19, 2004

(65) Prior Publication Data

US 2005/0112874 A1    May 26, 2005

Related U.S. Application Data

(63) Continuation-in-part of application No. 10/829,894, filed on Apr. 21, 2004, now Pat. No. 6,884,465, which is a continuation of application No. 10/003,749, filed on Oct. 23, 2001, now Pat. No. 6,743,475.

(30) Foreign Application Priority Data

Oct. 23, 2000    (FI) .................................. 20002323

(51) Int. Cl.
*C23C 16/40* (2006.01)
(52) U.S. Cl. ......................... 427/255.29; 427/255.31; 117/88
(58) Field of Classification Search ............ 427/255.29, 427/255.31; 117/88
See application file for complete search history.

(56) References Cited

U.S. PATENT DOCUMENTS 5,916,365 A * 6/1999 Sherman ...................... 117/92

(Continued)

FOREIGN PATENT DOCUMENTS

JP            58033841         2/1983

(Continued)

OTHER PUBLICATIONS

Hiltunen et al. "Growth and Characterization of Aluminum Oxide Thin Films Deposited from Various Source Materials by Atomic Layer Epitaxy and Chemical Vapor Desposition Processes", Materials Chemistry and Physics, 28 (1991) pp. 379-388.

(Continued)

*Primary Examiner*—Bret Chen
(74) *Attorney, Agent, or Firm*—Knobbe, Martens, Olson, & Bear LLP (57) ABSTRACT

A process for producing metal oxide thin films on a substrate by the ALD method comprises the steps of bonding no more than about a molecular monolayer of a gaseous metal compound to a growth substrate, and converting the bonded metal compound to metal oxide. The bonded metal compound is converted to metal oxide by contacting it with a reactive vapor source of oxygen other than water, and the substrate is kept at a temperature of less than 190° C. during the growth process. By means of the invention it is possible to produce films of good quality at low temperatures. The dielectric thin films having a dense structure can be used for passivating surfaces that do not endure high temperatures. Such surfaces include, for example, organic films in integrated circuits and polymer films such as in organic electroluminescent displays and organic solar cells. Further, when a water-free oxygen source is used, surfaces that are sensitive to water can be passivated.

28 Claims, 4 Drawing Sheets

U.S. PATENT DOCUMENTS

| | | | | |
|---|---|---|---|---|
| 6,015,590 | A * | 1/2000 | Suntola et al. | 427/255.23 |
| 6,124,158 | A | 9/2000 | Dautartas et al. | 438/216 |
| 6,200,893 | B1 * | 3/2001 | Sneh | 438/685 |
| 6,203,613 | B1 * | 3/2001 | Gates et al. | 117/104 |
| 6,342,277 | B1 | 1/2002 | Sherman | |
| 6,451,695 | B2 | 9/2002 | Sneh | |
| 6,458,416 | B1 | 10/2002 | Derderian et al. | |
| 6,743,475 | B2 * | 6/2004 | Skarp et al. | 427/255.31 |
| 6,884,465 | B2 * | 4/2005 | Skarp et al. | 427/255.31 |
| 2001/0031379 | A1 | 10/2001 | Tera et al. | |
| 2001/0052752 | A1 | 12/2001 | Ghosh et al. | |
| 2002/0003403 | A1 | 1/2002 | Ghosh et al. | |
| 2003/0129298 | A1 | 7/2003 | Tera et al. | |

FOREIGN PATENT DOCUMENTS

| | | |
|---|---|---|
| WO | WO 00/55895 | 9/2000 |
| WO | WO 03/008110 A1 | 1/2003 |

OTHER PUBLICATIONS

Kattelus, H. et al., "Electrical Properties of Tantalum Based Composite Oxide Films," *Mat. Res. Soc. Symp. Proc.*, vol. 284, pp. 511-516 (1993).

Kattelus, H. et al., "Layered tantalum-aluminum oxide films deposited by atomic layer epitaxy," *Thin Solid Films*, vol. 225, pp. 296-298 (1993).

Kim. Y. K. et al., "Novel capicitor technology for high density stand-alone and embedded DRAMs," *IEEE International Electron Devices Meeting*, IEDM (2000).

Kukli et al, "Atomic layer epitaxy growth of aluminum oxide thin films from a novel Al(CH3)2Cl precursor and H2O.", J. Vac. Sci. Technol. A 15(4), Jul./Aug. 1997, pp. 2214-2218.

Kukli, K. et al., "Properties of $Ta_2O_5$-Based Dielectric Nanolaminates Deposited by Atomic Layer Epitaxy," *J. Electrochem. Soc.*, vol. 144, No. 1, pp. 300-306 (1997).

Kukli, K. et al., Properties of $(Nb_{1-x}Ta_x)_2O_5$ Solid Solutions and $(Nb_{1-x}Ta_x)_2O_5$-$ZrO_2$ Nanolaminates Grown by Atomic Layer Epitaxy, *NanoStructured Materials*, vol. 8, No. 7, pp. 785-793 (1997).

Kukli, K., "Properties of atomic layer deposited $(Ta_{1-x}Nb_x)_2O_5$ solid solution films and $Ta_2O_5$-$Nb_2O_5$ nanolaminates," *Journal of Applied Physics*, vol. 86, No. 10 (1999).

Lakomaa, E-L. et al., "Surface reactions in $Al_2O_3$ growth from trimethylaluminum and water by atomic layer epitaxy," *Applied Surface Science*, vol. 107, pp. 107-115 (1996).

Ritala, M. et al., "Surface roughness reduction in atomic layer epitaxy growth of titanium dioxide thin films," *Thin Solid Films*, vol. 249, pp. 155-162 (1994).

Zhang, H. et al. "High permittivity thin film nanolaminates," *Journal of Applied Physics*, vol. 87, No, 4, pp. 1921-1924 (2000).

Hiltunen et al. "Growth and Characterization of Aluminum Oxide Thin Films Deposited from Various Source Materials by Atomic Layer Epitaxy and Chemical Vapor Deposition Processes", Materials Chemistry and Physics, 28 (1991) pp. 379-388.

Kattelus, H. et al., "Electrical Properties of Tantalum Based Composite Oxide Films," *Mat. Res. Soc. Symp. Proc.*, vol. 284, pp. 511-516 (1993).

Kattelus, H. et al., "Layered tantalum-aluminum oxide films deposited by atomic layer epitaxy," *Thin Solid Films*, vol. 225, pp. 296-298 (1993).

Kim. Y. K. et al., "Novel capicitor technology for high density stand-alone and embedded DRAMs," *IEEE International Electron Devices Meeting*, IEDM (2000).

Kukli et al, "Atomic layer epitaxy growth of aluminum oxide thin films from a novel Al(CH3)2Cl precursor and H2O.", J. Vac. Sci. Technol. A 15(4), Jul./Aug. 1997, pp. 2214-2218.

Kukli, K. et al., "Properties of $Ta_2O_5$-Based Dielectric Nanolaminates Deposited by Atomic Layer Epitaxy," *J. Electrochem. Soc.*, vol. 144, No. 1, pp. 300-306 (1997).

Kukli, K. et al., Properties of $(Nb_{1-x}Ta_x)_2O_5$ Solid Solutions and $(Nb_{1-x}Ta_x)_2O_5$-$ZrO_2$ Nanolaminates Grown by Atomic Layer Epitaxy, *NanoStructured Materials*, vol. 8, No. 7, pp. 785-793 (1997).

Kukli, K., "Properties of atomic layer deposited $(Ta_{1-x}Nb_x)_2O_5$ solid solution films and $Ta_2O_5$-$Nb_2O_5$ nanolaminates," *Journal of Applied Physics*, vol. 86, No. 10 (1999).

Lakomaa, E-L. et al., "Surface reactions in $Al_2O_3$ growth from trimethylaluminum and water by atomic layer epitaxy," *Applied Surface Science*, vol. 107, pp. 107-115 (1996).

Ritala, M. et al., "Surface roughness reduction in atomic layer epitaxy growth of titanium dioxide thin films," *Thin Solid Films*, vol. 249, pp. 155-162 (1994).

Zhang, H. et al., "High permittivity thin film nanolaminates," *Journal of Applied Physics*, vol. 87, No. 4, pp. 1921-1924 (2000).

* cited by examiner

PROCESS FOR PRODUCING METAL OXIDE FILMS AT LOW TEMPERATURES

REFERENCE TO RELATED APPLICATIONS

The present application is a continuation-in-part of U.S. application Ser. No. 10/829,894, filed Apr. 21, 2004, now U.S. Pat. No. 6,884,465, which is a continuation of U.S. application Ser. No. 10/003,749, filed Oct. 23, 2001, now U.S. Pat. No. 6,743,475 and claims priority under 35 U.S.C. §119(a) to Finnish Patent Application No. 20002323, filed Oct. 23, 2000.

BACKGROUND OF THE INVENTION

1. Field of the Invention

The present invention concerns a process for producing metal oxide films by an ALD type process. According to the preferred process the metal oxide films are produced at low temperatures by bonding a metal compound on a substrate and converting said metal compound into a metal oxide.

2. Description of Related Art

Dielectric thin films having a high dielectric constant (permittivity) have a number of applications in the field of micro electronics. For example, they may replace the $SiO_2$ and $Si_3N_4$ presently used in DRAM-memories in order to maintain the necessary capacitance as the size of capacitors is reduced.

$Al_2O_3$ films suitable for passivating surfaces have previously been prepared by physical processes, such as sputtering. The problem with the films produced by sputtering has been the unevenness of the resulting film, and the pinholes that are formed in the film. These pinholes may form a diffusion path for water through the film.

U.S. Pat. No. 6,124,158 discloses a method of reducing carbon contamination of $Al_2O_3$ thin films deposited by an ALD method. The ALD process uses organic aluminum precursors and water. In at least every three cycle, ozone is introduced into the reaction chamber to reduce carbon contaminants. The process has its limits since aluminum oxide films deposited below 190° C. were not dense and reproducible.

ALD methods have also been used for producing $Al_2O_3$ films by using aluminum alkoxides, trimethyl aluminum (TMA) or $AlCl_3$ as the aluminum source material and water, alcohols, $H_2O_2$ or $N_2O$ as the oxygen source material. $Al_2O_3$ films from TMA and water have been deposited at temperatures in the range from 150 to 400° C. Typically the temperature has been between 150° C. and 300° C. The resulting films had uniform thickness and did not contain any pinholes. However, the density of the film has been questionable at the lower end of the deposition temperature range.

In applications involving organic polymers or low molecular weight organic molecules, such as organic EL displays, also known as organic light-emitting displays or organic light-emitting diodes (OLED), the deposition temperature is preferably less than 150° C., while in applications where the substrate is sensitive to water it is not feasible to use water as the oxygen source material. Further, the substrates with organic layers are typically exposed to alkaline solutions during certain process steps, which imposes strict requirements to the properties of the protective layer on the organic surface. Pinholes are not tolerated at all in protective layers. Thus there is a need for a process of producing metal oxide films by ALD at low temperatures using an oxygen source other than water.

SUMMARY OF THE INVENTION

The present invention is based on the surprising finding that high-quality metal oxide thin films can be grown by an ALD type process at substrate temperatures down to about 50° C. Another surprising finding is that ozone can be used in the deposition process without destroying the properties of substrates that contain an organic layer. A dense, pinhole-free thin film layer can be produced very quickly by ALD on the substrate surface, which protects the sensitive materials underneath the surface against the surrounding gas atmosphere.

In accordance with one aspect of the present invention a process is provided for depositing a thin film of metal oxide on a substrate by an atomic layer deposition process that comprises a plurality of cycles. Each cycle comprises supplying a first reactant that comprises a gaseous metal compound and supplying a gaseous second reactant that comprises a source of oxygen other than water. The second reactant converts the adsorbed portion of the first reactant on the substrate to metal oxide. Preferably the substrate is maintained at a temperature of less than 190° C. during the ALD process.

A number of considerable advantages is obtained by means of the preferred embodiments. For example, with the aid of the present invention, it is possible to produce metal films of good quality at low temperatures.

Dielectric thin films with a dense structure can be used for passivating surfaces that do not tolerate high temperatures. Such surfaces include, for example, polymer films. If a water-free oxygen source is used, surfaces that are sensitive to water can also be passivated.

In addition, dielectric films, including metal oxide thin films, with a dense structure can be used as buffer layers between functional films that include at least one organic film. The dielectric film then prevents either reaction or diffusion between the functional films.

DETAILED DESCRIPTION OF THE INVENTION

Definitions

For the purpose of the present invention, an "ALD type process" designates a process in which deposition of a thin film from gaseous source chemicals onto a surface is based on sequential self-saturating surface reactions. The principles of the ALD process are disclosed, e.g., in U.S. Pat. No. 6,015,590.

"Reaction space" is used to designate a reactor or reaction chamber in which the conditions can be adjusted so that the deposition of a thin film on a substrate by ALD is possible.

"Thin film" is used to designate a film that is grown from elements or compounds that are transported as separate ions, atoms or molecules via vacuum, gaseous phase or liquid phase from the source to the substrate. The thickness of the film depends on the application and it varies in a wide range, e.g., from one molecular layer (about 0.5 nm) up to 1,000 nm, or even more.

"Metal oxide" is used to designate a thin film that comprises at least one metal bound to oxygen. Preferably, the metal is selected from the group consisting of metals of Groups IIA, IIIB, IVB, VB and VIB. More preferably, the metal is selected from the group consisting of Mg, Sc, Y, La, Ce, Pr, Nd, Sm, Eu, Gd, Tb, Dy, Ho, Er, Tm, Yb, Lu, Ti, Zr, Hf, V, Nb, Ta, Cr, Mo and W.

A thin film comprising metal oxide may comprise, for example and without limitation, a single metal oxide (e.g. $Al_2O_3$, $Ta_2O_5$, $TiO_2$, $ZrO_2$ or $HfO_2$), solid solutions of metal oxides (e.g. $Ta_{2x}Nb_{2-2x}O_5$ or $Ti_m Zr_{1-m} O_2$), ternary metal oxides (e.g. aluminum titanate $Al_2TiO_5$ or hafnium silicate $HfSiO_4$), doped metal oxides (e.g. $Al_2O_3$:Ta or $TiO_2$:Ta), and layered or nanolaminate metal oxides (e.g. $Al_2O_3/Ta_2O_5$ or $Al_2O_3/TiO_2$).

By "dense" structure is meant a thin film which has a smaller leakage current through it, or which has a lower permeability to ions or gases when comparing two thin films consisting essentially of the same basic material, such as two thin film of $Al_2O_3$ deposited by different processes.

The Deposition Process

A metal oxide thin film, such as $Al_2O_3$, $Ta_2O_5$, $TiO_2$ or $HfO_2$, functioning as a dielectric or a passivating layer is grown on a desired substrate by ALD. The substrate is heated to the processing temperature, which is preferably selected from a range of about 50° C. to about 190° C. More preferably the processing temperature is less than about 150° C., even more preferably less than about 125° C. and even more preferably less than about 100° C.

The metal source chemicals used in the ALD processes preferably have metal—carbon and/or metal—nitrogen chemical bonds or coordination bonds between the central metal atom and its ligands. In addition, metal alkoxides that have metal—oxygen bond may be used.

Although metal halides may used as metal source chemicals, it is generally preferred that the metal source chemical contain as few metal—halogen bonds as possible, because it is difficult to remove halogen atoms from the substrate surface at low process temperatures. More preferably the metal source chemical is not a metal halide.

In addition, the source chemical is preferably thermally stable. That is, the metal source chemical preferably does not decompose thermally during the pulse time at the deposition temperature. Further, the metal source chemical preferably has sufficient vapor pressure (at least about 0.05 mbar) at the source temperature. The source temperature should be lower than the deposition temperature to prevent uncontrollable condensation of the source chemical on the substrate. The source chemical molecules should chemisorb on the substrate so that no more than about a molecular monolayer of the source chemical molecules stay on the surface before the next source chemical pulse arrives to the reaction chamber.

Exemplary metal source chemicals are listed below by their Group number in the Periodic Table of the Elements. However, the invention is not limited to the disclosed chemicals because the skilled artisan will recognize that similar chemicals and derivatives of disclosed chemicals can be used in the deposition process without departing from the scope of the invention.

Source chemicals can be obtained, for example, from Sigma-Aldrich, USA.

Group IIA:

Preferred Group IIA metal compounds include compounds of magnesium (Mg), particularly cyclopentadienyl compounds of magnesium such as bis(cyclopentadienyl)magnesium.

Group IIIB

Preferred group IIIB metal compounds include compounds of scandium (Sc), yttrium (Y), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb) and lutetium (Lu). Particularly preferred are cyclopentadienyl compounds, such as tris(tetramethylcyclopentadienyl)lanthanum; and silylamide compounds, such as tris[N,N-bis(trimethylsilyl)amide] lanthanum(III).

Group IVB:

Preferred group IVB metal compounds include compounds of titanium (Ti), zirconium (Zr) and hafnium (Hf). Particularly preferred are dialkylamide compounds (also referred to as dialkylamino compounds) such as methylethylamides, e.g. tetrakis(ethylmethylamide)hafnium (TEMAH), tetrakis(dimethylamide)hafnium (TDMAH), tetrakis(ethylmethylamino)zirconium and tetrakis(ethylmethylamino)titanium; cyclopentadienyl compounds such as trimethoxy(pentamethylcyclopentadienyl)titanium(IV); and alkoxide compounds such as titanium(IV)tert-butoxide.

Group VB:

Preferred group VB metal compounds include compounds of vanadium (V), niobium (Nb) and tantalum (Ta). Particularly preferred are dialkylamino compounds such as pentakis(dimethylamino)tantalum; imino compounds such as tris(diethylamino)(ethylimino)tantalum and tris(diethylamino)(tert-butylimino)tantalum; cyclopentadienyl compounds; silylamide compounds such as bis(cyclopentadienyl)N,N-bis(trimethylsilyl)amidevanadium and tris[N,N-bis(trimethylsilyl)amide]vanadium(III); β-diketonate compounds such as vanadium(III)acetylacetonate; and alkoxide compounds such as vanadium(V) oxytriethoxide, niobium(V)ethoxide and tantalum pentaethoxide.

Group VIB:

Preferred group VIB metal compounds include compounds of chromium (Cr), molybdenum (Mo) and tungsten (W). Particularly preferred are carbonyl compounds such as chromium hexacarbonyl $Cr(CO)_6$, tungsten hexacarbonyl $W(CO)_6$, molybdenum hexacarbonyl $Mo(CO)_6$ and tricarbonyl(mesitylene)tungsten; cyclopentadienyl compounds such as bis(cyclopentadienyl)tungsten dihydride, bis(cyclopentadienyl)ditungsten hexacarbonyl and bis(ethylcyclopentadienyl)chromium; and derivatives of cyclopentadienyls such as bis(isopropylcyclopentadienyl)tungsten dihydride.

Group IIIA:

Preferred Group IIIA metal source compounds include aluminum (Al) compounds, particularly organoaluminum compounds comprising at least one alkyl group bound to aluminum, such as monoalkyl aluminum compounds $L^1AlX_2$ wherein X is selected from the group consisting of H, F, Cl, Br, I, RCHO, wherein RCHO is an alkoxy group and $L^1$ is a linear or branched hydrocarbon that is saturated or unsaturated; dialkyl aluminum compounds $L^1L^2AlX$ wherein X is selected from the group consisting of H, F, Cl, Br, I, RCHO, wherein RCHO is an alkoxy ligand and $L^1$ and $L^2$ are linear or branched hydrocarbons with single, double and/or triple bonds between carbon atoms; and trialkyl aluminum compounds $L^1L^2L^3Al$ wherein $L^1$, $L^2$ and $L^3$ are linear or branched hydrocarbons with single, double and/or triple bonds between carbon atoms.

Most preferably trimethyl aluminum $(CH_3)_3Al$, also known as TMA, is used as the aluminum source chemical.

The metal source compound is preferably introduced into the reaction chamber in gaseous phase and contacted with the substrate surface.

Group VIA: Oxygen O Source Chemicals

Strongly oxidizing source chemicals containing oxygen are preferably used. In preferred embodiments, one or more oxygen source chemicals selected from the following group are used: ozone, organic ozonides, oxygen atoms containing unpaired electrons, organic peroxides and organic peracids.

Figure 3:
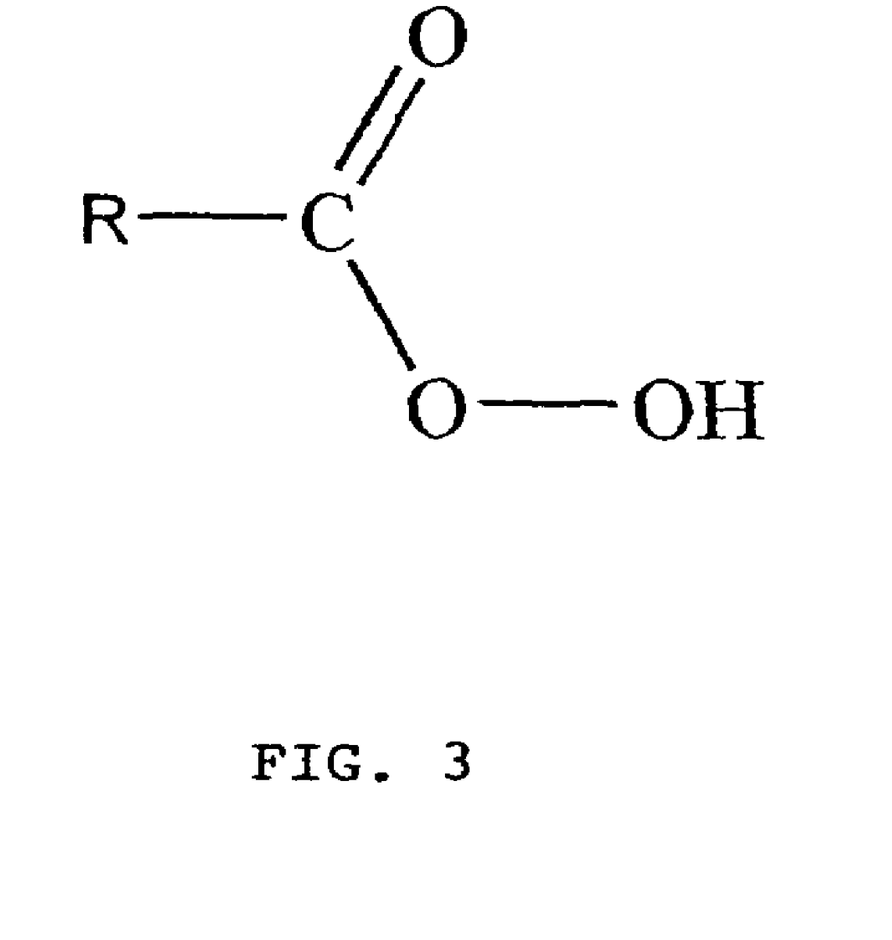
FIG. 3 depicts the structure of preferred peracids, such as peracetic acid $CH_3COOOH$, which contain OOH and O groups bound to the same carbon atom.

Preferred peracids, such as peracetic acid $CH_3COOOH$, contain OOH and O groups bound to the same carbon atom as depicted in FIG. 3.

Figure 4:
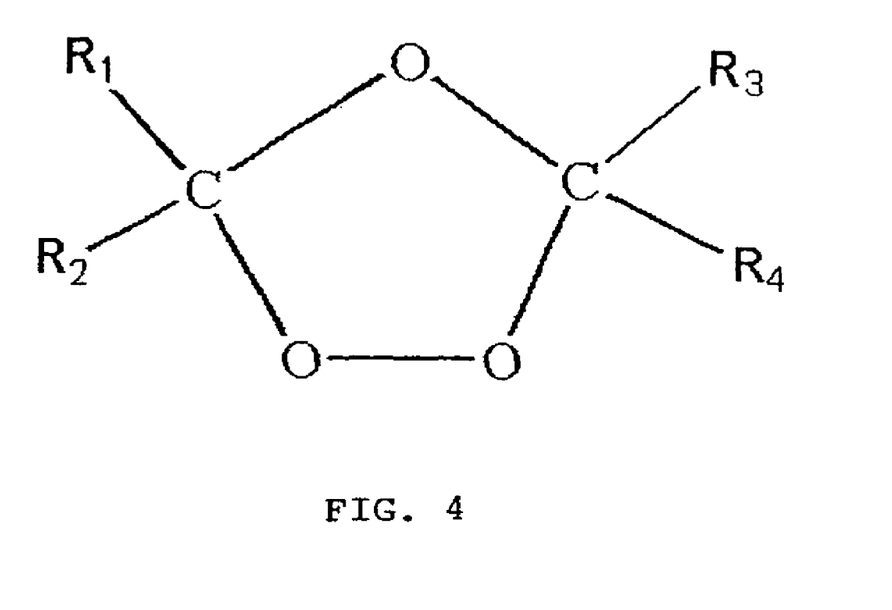
FIG. 4 depicts the structure of preferred organic ozonides, which contain both O and O—O groups between two carbon atoms.

Preferred organic ozonides contain both O and O—O groups between two carbon atoms, as depicted in FIG. 4.

Dimethyl peroxide and benzoyl peroxide are examples of suitable organic peroxides. In addition, other preferred peroxides include peroxides of formula I and II:

wherein $R^1$ and $R^2$ are linear, branched or cyclic organic ligands such as $CH_3$, $(CH_3)_3C$, $C_6H_5$ or benzoyl; and wherein $R^1$ is a linear, branched or cyclic organic ligand such as $CH_3$, $(CH_3)_3C$ or $C_6H_5$.

Most preferably ozone is used as an oxygen source. Water is preferably not used as a source chemical in the deposition process. The resulting growth rate of aluminum oxide from TMA and ozone may be as good as around 0.8 Å/cycle. It is assumed that the surface reactions between ozone and trimethyl aluminum or fractions of trimethyl aluminum bound to surface, such as dimethyl aluminum and monomethyl aluminum, provide enough OH groups on the aluminum oxide surface for the self-saturating chemisorption reaction of the following trimethyl aluminum pulse with the substrate surface.

In addition to serving as an oxygen source for the process, ozone also contains a lot of chemical energy that is released when the molecule is broken.

(N. N. Greenwood and A. Earnshaw, "Chemistry of the Elements", Pergamon Press Ltd., Oxford, England 1986.)

Figure 5:
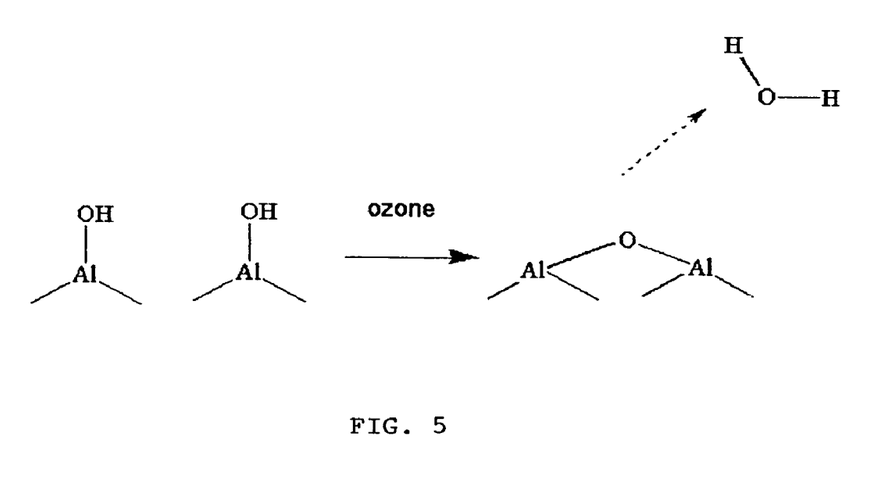
FIG. 5 depicts the elimination of surplus OH groups and formation of Al—O—Al bridges that may lead to the densification of $Al_2O_3$ surfaces.

As a result, the break up of ozone molecules can provide additional energy to the top molecular layers of surfaces and thus promote some surface reactions. The densification of $Al_2O_3$ surface may proceed via elimination of surplus OH groups and formation of Al—O—Al bridges as depicted in FIG. 5.

Also when the O—O bond of an organic peroxide breaks, the resulting RO* fragments are highly reactive.

Before introduction to the reaction chamber, the ozone or other oxygen source is optionally diluted with inactive gases. For example, oxygen gas, inert gases such as nitrogen, or noble gases such as argon may be used for this purpose.

Examples of applications for which the metal oxide films prepared according to the present process are particularly suitable include organic light-emitting diodes or displays (OLED), organic electroluminescent displays (OEL), organic solar cells (OSC), integrated circuits having organic layers and surface acoustic wave (SAW) filters. These applications generally require a low deposition temperature and/or are sensitive to moisture and/or oxygen.

Figure 1:
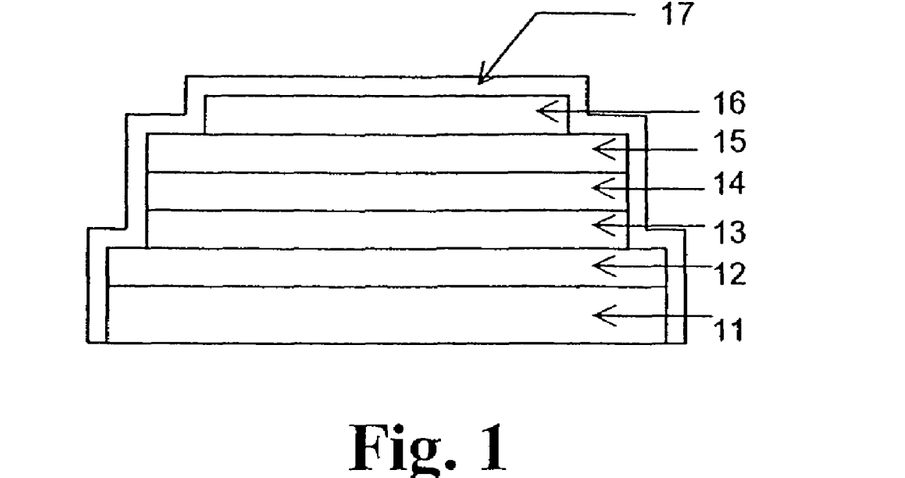
FIG. 1 is a schematic depiction of a cross-section of an organic EL display which is sealed against surrounding gas atmosphere with a passivating layer.

According to a first preferred embodiment of the present invention, an organic EL display is provided with a passivating layer according to a preferred deposition process. A typical organic EL display is produced by arranging an anode 12 on a substrate 11 (cf. FIG. 1) that typically is made of glass or a similar material. A hole transport layer 13 is deposited on the anode 12 and an emission layer 14 is deposited on the hole transport layer 13. Further, a layer 15 capable of transporting electrons is deposited on the emission layer 14. All these layers 13-15 preferably comprise organic material. The organic material may be polymeric or low molecular weight molecules. A cathode 16 is then formed on the layer 15 capable of transporting electrons. The cathode 16 is preferably made of a metal such as aluminum, magnesium or calcium-coated aluminum. These metals easily acquire an oxide layer on the surface that may be detrimental to the interface between the metal and the organic layer. A passivating layer 17 is therefore deposited on the surfaces of the resulting structure by the present process. It is to be noted that "surfaces" refers to all the possible surfaces. Thus, vertical surfaces are also preferably passivated.

Figure 2:
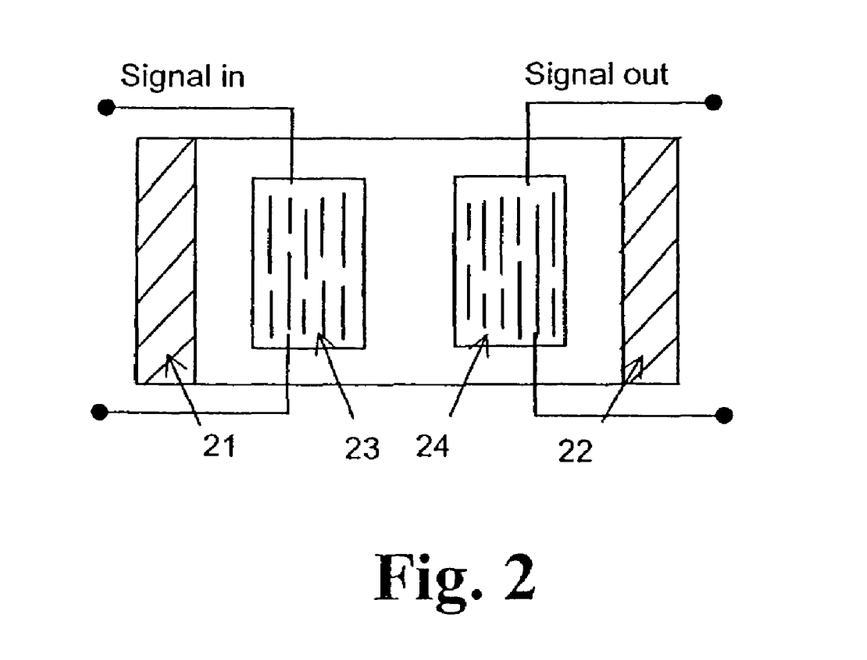
FIG. 2 depicts a structure of a SAW (Surface Acoustic Wave) filter.

According to a second preferred embodiment of the present invention, a SAW filter is provided with a protective layer according to the preferred deposition processes. A typical SAW filter is presented in FIG. 2. It comprises a first acoustic absorber 21 and a second acoustic absorber 22 placed on a piezoelectric substrate that is typically quartz, lithium niobate or lithium tantalate. The incoming signal is conducted to an input transducer 23 and the outgoing signal is collected from an output transducer 24. The input transducer 23 converts electrical signals to small acoustic waves that are reconverted to electrical signals by the output transducer 24. Usually the structure is hermetically encapsulated. The present invention replaces the hermetical encapsulation with a thin protective layer that is deposited on the surface of the SAW structure by the described process. Thus, a cheaper encapsulation process can be applied to the protected structure to obtain a finished SAW product.

In each of the above embodiments, the metal oxide passivation layer is preferably between about 5 nm and 1,000 nm in thickness, more preferably between about 25 nm and 75 nm.

In some embodiments the protective metal oxide layer comprises a single metal oxide, such as $Ta_2O_5$ or $TiO_2$, or a ternary metal oxide, such as $Al_2TiO_5$. In other embodiments the metal oxide layer comprises a metal oxide doped with a different metal or metal oxide. For example, an aluminum oxide layer or a titanium oxide layer may be doped with a different metal such as Ta. In other embodiments the metal oxide layer is a nanolaminate structure comprising alternating layers of different metal oxides, such as aluminum oxide and titanium oxide or aluminum oxide and tantalum oxide.

In other embodiments the passivating layer is a solid solution comprising two or more metal oxides. For example, the metal oxide layer may comprise $Ta_{2x}Nb_{2-2x}O5$ or $Ti_mZr_{1-m}O_2$.

Examples of ALD reactors in which the low-temperature process can be performed include single wafer reactors, reactors with multiple wafers or other substrates in a planar or vertical substrate holder and batch process reactors. For example, organic solar cells are preferably coated with a protective layer by the process in a batch process reactor to keep the manufacturing costs per substrate low.

The invention is further illustrated with the aid of the following non-limiting working examples.

EXAMPLE 1

Depositing $Al_2O_3$ Thin Films Using Either Water or Ozone as an Oxygen Source

Case A: Deposition of $Al_2O_3$ Films with Water as an Oxygen Source $Al_2O_3$ thin films were deposited in a flow-type ALD reactor, model F-120, manufactured by ASM Microchemistry Oy, Finland. Trimethyl aluminum $(CH_3)_3Al$, also known as TMA, was used as an aluminum source chemical. Purified water was used as an oxygen source chemical. The source chemicals were introduced from external sources to the reactor.

A substrate was provided to the reaction space and the reactor was evacuated to vacuum with a mechanical vacuum pump. Next, the pressure of the reaction space was adjusted to a range of approximately 5-10 mbar with flowing nitrogen gas. Then the reaction space was heated to the deposition temperature.

The thin films were deposited at either 100° C. or 300° C. The source chemicals were pulsed into the reaction space according to the principles of ALD, e.g. the pulses were separated from each other with inert gas to prevent mixing of the source chemicals in the gas phase of the reaction space. Only surface reactions were allowed to occur.

The pulsing cycle was as follows:

| | |
|---|---|
| TMA pulse | 0.5 s |
| $N_2$ purge | 1.0 s |
| $H_2O$ pulse | 0.4 s |
| $N_2$ purge | 1.5 s |

The growth rate of $Al_2O_3$ from TMA and $H_2O$ was 0.8 Å/cycle at 300° C. and 0.5 Å/cycle at 100° C. The refractive index was 1.64 for the film grown at 300° C. and 1.59 for the film grown at 100° C. The films grown at 100° C. started to leak immediately in the electrical measurements and it was impossible to measure exact values for capacitance or breakdown voltage. It appeared that the films were not very dense. A summary of the properties is presented below in Table 1.

Case B: Deposition of $Al_2O_3$ Film with Ozone as an Oxygen Source $Al_2O_3$ thin films were deposited in a flow-type ALD reactor, model F-120, manufactured by ASM Microchemistry Oy, Finland. Trimethyl aluminum $(CH_3)_3Al$, also known as TMA, was used as an aluminum source chemical. Ozone prepared on the premises was used as an oxygen source chemical. The source chemicals were introduced from external sources to the reactor.

A substrate was provided to the reaction space and the reactor was evacuated to vacuum with a mechanical vacuum pump. Next, the pressure of the reaction space was adjusted to a range of approximately 5-10 mbar with flowing nitrogen gas. Then the reaction space was heated to the deposition temperature.

The thin films were deposited at either 100° C. or 300° C. The source chemicals were pulsed into the reaction space according to the principles of ALD as in case A.

The pulsing cycle was as follows:

| | |
|---|---|
| TMA pulse | 0.5 s |
| $N_2$ purge | 1.0 s |
| $O_3$ pulse | 4.0 s |
| $N_2$ purge | 1.5 s |

A summary of the properties of the resulting thin films is presented below in Table 1.

TABLE 1

| | Case B | Case B | Case A | Case A |
|---|---|---|---|---|
| Deposition temperature | 100° C. | 300° C. | 100° C. | 300° C. |
| Growth rate (Å/cycle) | 0.8 | 0.8 | 0.5 | 0.8 |
| Refractive index | 1.58 | 1.66 | 1.59 | 1.64 |
| Dielectric constant | 6.0 | 8.3 | * | |
| Breakdown voltage (MV/cm) | 4.5 | 6.0 | * | |

* The measurement could not be carried out due to electrically very leaky thin film.

A TOF-ERDA analysis of the film grown from TMA and ozone at 100° C. revealed that the film contained 6.0% of carbon and 15.8% of hydrogen.

A comparison between Case A and Case B shows that replacing water with ozone was beneficial for the deposition process at low temperature.

EXAMPLE 2

Depositing $Al_2O_3$ Thin Films on an Organic Layer Using Ozone as an Oxygen Source A substrate with an organic thin film was provided into the reaction space of an F-450 ALD reactor manufactured by ASM Microchemistry Oy, Finland. The pressure of the reaction space was adjusted to about 5-10 mbar with a mechanical vacuum pump and flowing nitrogen gas that had a claimed purity of 99.9999%. Then the temperature of the reaction space was adjusted to about 110° C. TMA evaporated from an external source and ozone prepared on the premises were alternately introduced into the reaction space and contacted with the surface. The pulsing times were 1 s for TMA and 4 s for $O_3$. The source chemical pulses were separated from each other with nitrogen gas. The purging time lasted for 1.0-1.5 s after each source chemical pulse. The pulsing cycle consisting of these two source chemical pulses and two purging periods was repeated until a 50-nm aluminum oxide thin film was produced on the substrate. Typically, around 600 pulsing cycles were needed for the deposition. The deposition process did not adversely affect the organic layer. Further, the passivated structure could be stored at ordinary room air without destroying the functionality of the organic layer.

EXAMPLE 3

Depositing $HfO_2$ Thin Films on an Organic Layer Using Ozone as an Oxygen Source A substrate with an organic thin film was provided into the reaction space of a Pulsar® 2000 ALCVD™ reactor manufactured by ASM America, Inc., USA. The pressure of the reaction space was adjusted to about 5-10 mbar with a mechanical vacuum pump and flowing nitrogen gas that had a claimed purity of 99.9999%. Then the temperature of the reaction space was adjusted to about 100° C. Tetrakis(dimethylamino)hafnium TDMAH evaporated from an external source and ozone prepared on the premises were alternately introduced into the reaction space and contacted with the surface. TDMAH with a purity of 99.99% can be purchased e.g. from Sigma-Aldrich, USA. The pulsing times were 1 s for TDMAH and 2 s for $O_3$. The source chemical pulses were separated from each other with nitrogen gas. The reaction space was purged for about 1.0-2.0 s after each source chemical pulse.

A pulsing cycle consisting of these two source chemical pulses and two purging periods was repeated until a 30-nm hafnium dioxide ($HfO_2$) thin film was produced on the substrate. The growth rate of the dense $HfO_2$ thin film was 1.1 Å/cycle and the thickness non-uniformity (1 sigma) over the substrate area was 2%. When Tetrakis(dimethylamino) hafnium (TDMAH) was replaced with Tetrakis(ethylmethylamino)hafnium (TEMAH) in the process, it was possible to lower the deposition temperature down to about 50° C., which brings in considerable costs savings with respect to both the structure of the deposition reactor and the running costs of the process.

EXAMPLE 4

Depositing Layered $Al_2O_3/Ta_2O_5$ Thin Films on an Organic Layer Using Ozone as an Oxygen Source A substrate with an organic thin film was provided into the reaction space of an F-450 ALD reactor manufactured by ASM Microchemistry Oy, Finland. The F-450 reactor is suitable for single substrate and small batch processing. The pressure of the reaction space was adjusted to about 5-10 mbar with a mechanical vacuum pump and flowing nitrogen gas that had a claimed purity of 99.9999%. Then the temperature of the reaction space was adjusted to about 90° C. TMA evaporated from an external source and ozone prepared on the premises were alternately introduced into the reaction space and contacted with the surface. The pulsing times were 1 s for TMA and 4 s for $O_3$. The source chemical pulses were separated from each other by a purge step in which nitrogen gas was provided to the reaction space. The purging time lasted for 1.0-1.5 s after each source chemical pulse. A pulsing cycle consisting of the two source chemical pulses and two purging periods was repeated 480 times until a 40-nm aluminum oxide thin film was produced on the substrate.

Next, pentakis(dimethylamino)tantalum (PDMAT) evaporated from an external source and ozone prepared on the premises were alternately introduced into the reaction space and contacted with the surface. The pulsing times were 2.5 s for PDMAT and 3 s for $O_3$. The source chemical pulses were separated from each other by purging with flowing nitrogen gas. The purging time lasted for 1.0-1.5 s after each source chemical pulse. A pulsing cycle consisting of the two source chemical pulses and two purging periods was repeated until about 10 nm of $Ta_2O_5$ was deposited on the $Al_2O_3$ surface.

The deposition process did not adversely affect the organic layer. The passivated structure consisting of layered $Al_2O_3/Ta_2O_5$ could be stored at ordinary room air without destroying the functionality of the organic layer. Further, the $Ta_2O_5$ layer that was deposited on the $Al_2O_3$ surface improved the durability of the passivation layer against corrosive solutions such as NaOH solutions.

Although the foregoing invention has been described in terms of certain preferred embodiments, other embodiments will become apparent to those of ordinary skill in the art in view of the disclosure herein. Additionally, while one embodiment is disclosed in the context of an EL display, and another embodiment is disclosed in the context of a SAW filter, the skilled artisan will readily find application for the principles disclosed herein in a number of different contexts.

Accordingly, the present invention is not intended to be limited by the recitation of preferred embodiments, but is intended to be defined solely by reference to the claims.

The invention claimed is:

1. An atomic layer deposition (ALD) process for depositing a thin film of metal oxide on a substrate in a reaction chamber comprising a plurality of cycles, each cycle comprising:
    supplying a gaseous first reactant comprising a metal compound, wherein no more than about one molecular monolayer of the metal compound chemisorbs on the substrate; and
    supplying a gaseous second reactant comprising a source of oxygen other than water, wherein the second reactant converts the adsorbed portion of the first reactant on the substrate to metal oxide,
    wherein the substrate is maintained at a temperature of less than 190° C.

2. The process of claim 1, wherein the metal compound comprises a metal selected from the group consisting of metals of Groups IIA, IIIB, IVB, VB and VIB of the periodic table of elements.

3. The process of claim 2, wherein the metal is selected from the group consisting of Mg, Sc, Y, La, Ce, Pr, Nd, Sm, Eu, Gd, Tb, Dy, Ho, Er, Tm, Yb, Lu, Ti, Zr, Hf, V, Nb, Ta, Cr, Mo and W.

4. The process of claim 1, wherein the source of oxygen is selected from the group consisting of ozone, mixtures of ozone and oxygen, organic ozonides, oxygen atoms with unpaired electrons, organic peroxides and organic peracids.

5. The process of claim 4, wherein the source of oxygen is diluted with inactive gas.

6. The process of claim 1 claim, wherein the source of oxygen comprises one or more organic peroxides with the formula $R^1$—O—O—$R^2$ (IV), wherein $R^1$ is a linear, branched or cyclic organic ligand, and wherein $R^2$ is a hydrogen or a linear, branched or cyclic organic ligand.

7. The process of claim 1, wherein the substrate is maintained at a temperature of less than 150° C. during the ALD process.

8. The process of claim 1, wherein the substrate is maintained at a temperature of less than 125° C. during the ALD process.

9. The process of claim 1, wherein the substrate is maintained at a temperature of less than 100° C. during the ALD process.

10. The process of claim 1, wherein the cycles are repeated until a metal oxide film is formed with a thickness of about 5 to about 1000 nm.

11. The process of claim 1, wherein the substrate comprises an organic light emitting layer.

12. The process of claim 1, wherein the substrate comprises a surface acoustic wave filter.

13. The process of claim 1, wherein the substrate comprises an organic solar cell layer.

14. The process of claim 1, wherein the thin film is deposited over an organic thin film.

15. The process of claim 1, wherein the thin film is deposited on an aluminum oxide surface.

16. An atomic layer deposition (ALD) process for depositing a thin film of metal oxide on a substrate that is sensitive to moisture comprising a plurality of cycles, each cycle comprising:

forming no more than about one molecular monolayer of a metal compound on the substrate in a self-limiting reaction; and reacting the metal compound on the substrate with a source of oxygen other than water such that the metal reactant is converted to metal oxide, wherein the substrate is maintained at a temperature of less than 190° C. during the ALD process.

17. The process of claim 16, wherein the metal compound comprises a metal selected from the group consisting of Mg, Sc, Y, La, Ce, Pr, Nd, Sm, Eu, Gd, Tb, Dy, Ho, Er, Tm, Yb, Lu, Ti, Zr, Hf, V, Nb, Ta, Cr, Mo and W.

18. The process of claim 16, wherein the metal oxide is a ternary metal oxide.

19. The process of claim 16, wherein the metal oxide is doped with a different metal from the metal in the metal compound.

20. The process of claim 16, wherein the thin film protects the substrate from moisture.

21. The process of claim 16, wherein the thin film is deposited on a metal compound layer that was previously deposited by a process selected from the group consisting of chemical vapor deposition (CVD), physical vapor deposition (PVD) and atomic layer deposition (ALD).

22. The process of claim 16, wherein the thin film is deposited on a dielectric layer.

23. The process of claim 16, wherein the dielectric layer comprises aluminum oxide.

24. A process of depositing a thin film of metal oxide on a substrate that is sensitive to the surrounding atmosphere by an atomic layer deposition (ALD) process comprising a plurality of cycles, each cycle comprising:

contacting the substrate with a vapor phase first reactant comprising a metal compound, wherein no more than about one molecular monolayer of the metal compound is adsorbed on the substrate;

removing excess first reactant and gaseous reaction byproducts from the reaction space;

supplying gaseous ozone to the reaction space, wherein the ozone converts the adsorbed portion of the first reactant on the substrate to metal oxide; and removing excess ozone and gaseous reaction byproducts from the reaction space, wherein the substrate is maintained at a temperature of less than 190° C. during the ALD process.

25. The process of claim 24, wherein the thin film protects the substrate from the surrounding atmosphere.

26. The process of claim 24, wherein the thin film is deposited over a dielectric layer.

27. The process of claim 24, wherein the thin film is deposited over an aluminum oxide layer.

28. The process of claim 24, wherein the thin film is deposited over an organic layer.

* * * * *

UNITED STATES PATENT AND TRADEMARK OFFICE
Certificate

Patent No. 7,476,420 B2                                       Patented: January 13, 2009

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Jarmo Skarp, Espoo (FI); Mervi Linnermo, Klaukkala (FI); Timo Asikainen, Vantaa (FI); Eva Tois, Espoo (FI); Suvi P. Haukka, Helsinki (FI); and Tapio Kanniainen, Berikon (CH).

Signed and Sealed this Third Day of September 2013.

TIMOTHY H. MEEKS
*Supervisory Patent Examiner*
Art Unit 1715
Technology Center 1700